(12) United States Patent
Liu et al.

(10) Patent No.: US 10,133,838 B2
(45) Date of Patent: Nov. 20, 2018

(54) GUIDED DEFECT DETECTION OF INTEGRATED CIRCUITS

(71) Applicant: Dongfang Jingyuan Electron Limited, Beijing (CN)

(72) Inventors: Hua-Yu Liu, San Jose, CA (US); Jie Lin, San Jose, CA (US); Zhaoli Zhang, San Jose, CA (US); Zongchang Yu, San Jose, CA (US)

(73) Assignee: Dongfang Jingyuan Electron Limited, Beijing (CN)

( * ) Notice: Subject to any disclaimer, the term of this patent is extended or adjusted under 35 U.S.C. 154(b) by 118 days.

(21) Appl. No.: 15/419,624

(22) Filed: Jan. 30, 2017

(65) Prior Publication Data

US 2018/0218090 A1 Aug. 2, 2018

(51) Int. Cl.
*G06F 17/50* (2006.01)
*H01L 21/66* (2006.01)

(52) U.S. Cl.
CPC ........ *G06F 17/504* (2013.01); *G06F 17/5081* (2013.01); *H01L 22/12* (2013.01)

(58) Field of Classification Search
CPC .............................. G06F 17/5081; H01L 22/12
USPC ......................................... 716/110, 111, 112
See application file for complete search history.

(56) References Cited

U.S. PATENT DOCUMENTS

| | | | | |
|---|---|---|---|---|
| 6,174,632 B1* | 1/2001 | Pike | ...................... | G03F 7/7065 382/149 |
| 6,452,412 B1* | 9/2002 | Jarvis et al. | ....... | G01R 31/2831 324/750.3 |
| 6,673,638 B1* | 1/2004 | Bendik et al. | ...... | G03F 7/70625 430/30 |
| 7,052,921 B1* | 5/2006 | Plat | ..................... | G03F 7/70608 257/E21.53 |
| 7,975,245 B2* | 7/2011 | Florence et al. | ............................. | G01R 31/318314 382/144 |
| 8,460,946 B2* | 6/2013 | Markwort et al. | .......................... | G01N 21/9501 257/E21.576 |
| 2002/0035461 A1 | 3/2002 | Chang et al. | | |

(Continued)

OTHER PUBLICATIONS

International Search Report dated Feb. 6, 2018 from corresponding PCT Application No. PCT/US2017/059027.

*Primary Examiner* — Sun Lin
(74) *Attorney, Agent, or Firm* — Young Basile Hanlon & MacFarlane, P.C.

(57) ABSTRACT

A method and system for detecting defects of integrated circuits have been provided. The method comprises generating process sensitive patterns of an integrated circuit, scanning the process sensitive patterns using a high-resolution system to provide process condition parameters of the integrated circuit, determining care areas of the integrated circuit using the process condition parameters, and scanning the care areas using the high-resolution system to detect at least one defect of the integrated circuit. The system comprises a processor and a memory with instructions executable by the processor to generate process sensitive patterns of an integrated circuit, scan the process sensitive patterns using a high-resolution system to provide process condition parameters of the integrated circuit, determine care areas of the integrated circuit using the process condition parameters, and scan the care areas using the high-resolution system to detect at least one defect of the integrated circuit.

20 Claims, 8 Drawing Sheets

(56) References Cited

U.S. PATENT DOCUMENTS

2008/0279444 A1 11/2008 Fischer et al.
2010/0332206 A1 12/2010 Leu
2011/0170091 A1 7/2011 Chang et al.
2015/0324965 A1 11/2015 Kulkarni

* cited by examiner

GUIDED DEFECT DETECTION OF INTEGRATED CIRCUITS

TECHNICAL FIELD

This disclosure generally relates to inspecting integrated circuits, and more specifically, to a guided defect detection of integrated circuits.

BACKGROUND

The manufacture of integrated circuits is a multi-step process carried out on a substrate such as a wafer. Multiple integrated circuits (ICs) are typically produced on each wafer and each IC can be referred to as a die. Die inspection is one step of the manufacturing process. Inspection systems can detect defects that occur during the manufacturing process. Optical wafer inspection systems have been conventionally used for wafer and/or die inspection.

SUMMARY

Disclosed herein are aspects, features, elements, implementations, and implementations of guided defect detection of integrated circuits.

A method and system for detecting defects of integrated circuits have been provided. In a first aspect, the method comprises generating process sensitive patterns of an integrated circuit, scanning the process sensitive patterns using a high-resolution system to provide process condition parameters of the integrated circuit, determining care areas of the integrated circuit using the process condition parameters, and scanning the care areas using the high-resolution system to detect at least one defect of the integrated circuit.

In a second aspect, the system comprises a processor and a memory with instructions executable by the processor to generate process sensitive patterns of an integrated circuit, scan the process sensitive patterns using a high-resolution system to provide process condition parameters of the integrated circuit, determine care areas of the integrated circuit using the process condition parameters, and scan the care areas using the high-resolution system to detect at least one defect of the integrated circuit.

In a third aspect, the system comprises a monitoring device to determine process sensitive patterns of an integrated circuit, a scanning device to scan the process sensitive patterns to provide process condition parameters of the integrated circuit, a hot spot predictor to determine hot spots of the integrated circuit using the process condition parameters, and the scanning device to scan the hot spots to detect at least one defect of the integrated circuit.

These and other aspects of this disclosure are disclosed in the following detailed description, the appended claims, and the accompanying figures.

BRIEF DESCRIPTION OF THE DRAWINGS

The disclosure is best understood from the following detailed description when read in conjunction with the accompanying drawings.

DETAILED DESCRIPTION

Figure 1:
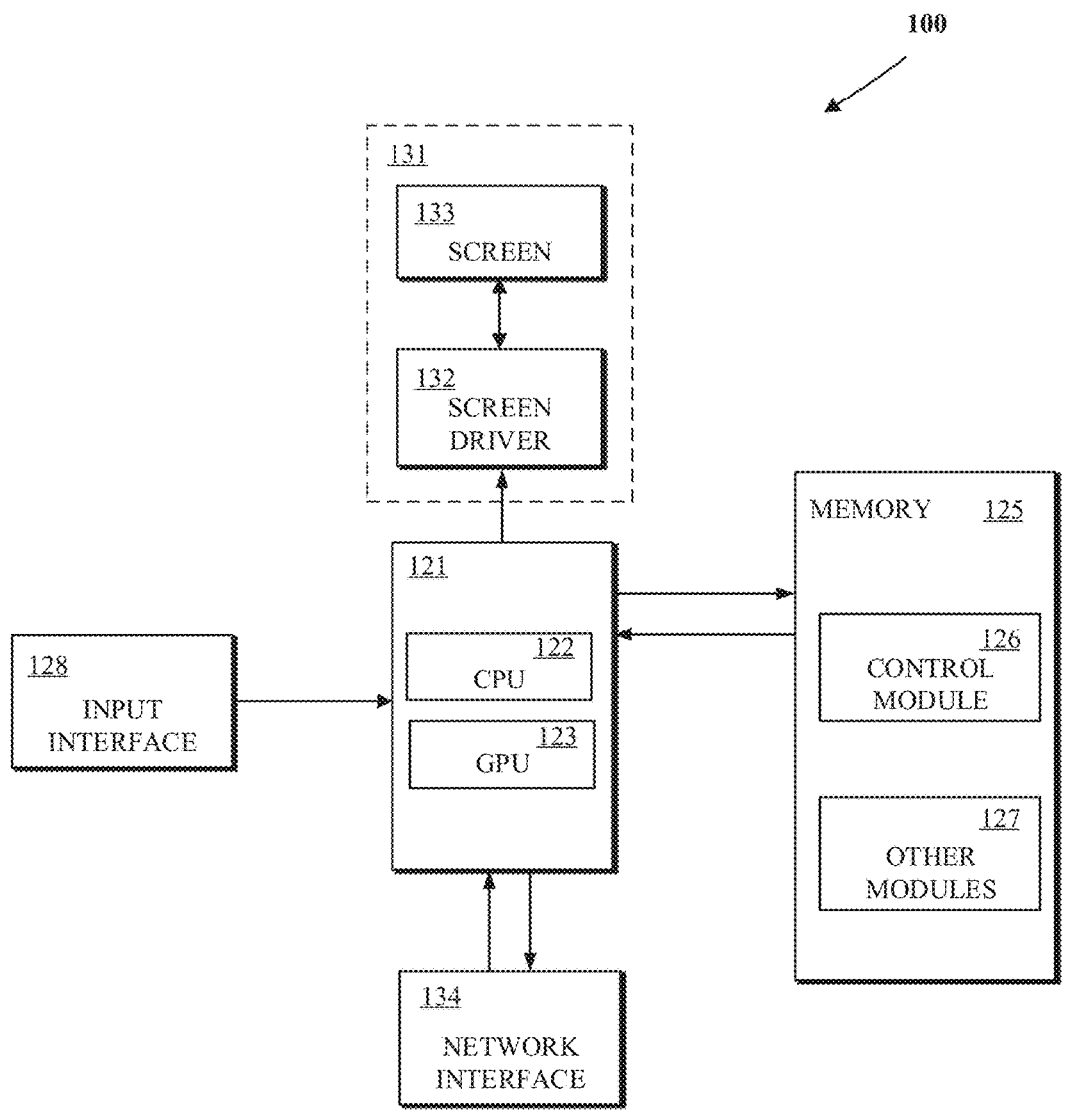
FIG. 1 is a block diagram of a computing device used for process condition analysis, care area generation, and defect detection in accordance with the present disclosure.

The manufacture of microchip devices continually strives for smaller sized elements to achieve higher density for integrated circuit (IC) designs on a target wafer. A wafer, also referred to as a substrate, is a thin slice of semiconductor material used for the fabrication of integrated circuits. For example, demand for 10 nanometer (nm) resolution and beyond now exists for features of logic circuits and arrays (e.g. finFETs, DRAMs, 3D NAND, etc.) in microchip semiconductor fabrication. The process of manufacturing integrated circuits (ICs) involves several phases, including a design phase, a manufacturing phase, and an inspection phase. During the inspection phase, ICs manufactured during the manufacturing phase are inspected for potential defects. The results of the inspection can be used to improve or adjust the design, the manufacturing, the inspection phases, and any combination thereof.

Detecting defects in such devices and/or defects of small sizes is a challenge in semiconductor manufacturing facilities. Conventional high throughput inspection systems (e.g., optical inspection systems) lack, for example, the resolution to find defects (e.g., physical defects) in manufactured devices. As such, optical inspection systems are not suitable for detecting defects with sizes below their optical resolutions. On the other hand, high resolution inspection systems, such as a scanning electron microscope (electron beam, e-beam, or EBeam) system, can detect such defects. However, e-beam systems have low throughput. As such, the applicability and suitability of e-beam systems for production line (or inline) defect inspection of integrated circuits has been limited. For example, one week or more may be required to fully scan a single integrated circuit or die using an e-beam system. As such, e-beam systems have conventionally been used during the IC design process or in an off-line inspection and review process and not in inline production systems.

Consequently, conventional semiconductor IC manufacturing facilities may use one set of systems for monitoring the fabrication process (i.e., inline production process) and another set of systems for detecting integrated circuit defects introduced during the production process. Using more than one set of systems is inefficient and costly. The systems can include, for example, systems targeted specifically at monitoring process variations in the production systems (i.e., systems used in the fabrication process) and systems including, but not limited to, those based on optical proximity correction (OPC) model simulations, that can generate concern or care areas associated with the integrated circuits. A care area is an area on a wafer that is to be inspected after fabrication for defects. A care area is typically identified before fabrication of the integrated circuits begins, such as, for example, during the IC design process.

Conventional generation of care areas typically involves manual steps and is time consuming. As such, care areas are conventionally generated by offline systems (i.e., offline to the production process) which do not typically receive or use feedback from the production process or from an offline e-beam system used for inspection. An e-beam system can be used offline to scan the generated care areas thereby generating scanning electron microscopy (SEM) images of the integrated circuits and underlying wafer. The SEM images are then analyzed offline for defects.

During fabrication, the fabrication process may vary or change. For example, variations in focus and dose can significantly impact resist sensitization. When separate systems are used in the production (e.g., monitoring the production line process) and inspection processes (e.g., detecting defects introduced in or by the production line process), and as certain systems are used offline (i.e., not used in or during the manufacturing line or production line process), these systems cannot be easily and dynamically adapted to a potentially constantly varying production environment (and corresponding process conditions). Manual work may be required to adjust the inspection process to new production conditions. For example, when process conditions in the production tools are changed to previously unknown values, the process-monitoring system may continue to monitor the production process and/or the inspection system may continue to inspect the integrated circuits based on the previous process conditions. As inspection care areas are based on previous process conditions, new defects may go undetected when the process conditions change. An e-beam system, inspecting previous care areas (i.e., previously identified care areas), may miss new defects, and may report that a wafer under inspection is without defects when defects, in fact, exist. This is not desirable in high-volume IC manufacturing as it results in lower yields.

A method and system in accordance with the present disclosure detects any potential process variations of a production environment (i.e., inline production process) and also detects potential defects that result from the detected process variations in one single system. As a result, the production line inspections of the integrated circuits are based on the process variations. A benefit of the present disclosure and the disclosed technology is that manufacturing facilities can maintain only one integrated tool set, thereby simplifying the manufacturing workflow and reducing the cost of tool ownership. Another benefit is being able to use high resolution e-beam systems for defect inspection on the manufacturing production line of integrated circuits.

Implementations of this disclosure provide technological improvements to semiconductor manufacturing machines (e.g., e-beam systems), processes and computer systems, for example, those semiconductor machines and computer systems concerning the monitoring of semiconductor manufacturing production lines, the detection of process condition variations, and the detection of defects associated with the integrated circuits being manufactured on the production lines. For example, the present disclosure provides for monitoring and detecting potential defects of the integrated circuits while the integrated circuits are being manufactured using high-resolution systems such as electron beam (e-beam) systems. Implementations of this disclosure can thus introduce new and efficient improvements in the ways in which integrated circuit defects are detected.

While the disclosure has been described in connection with certain embodiments and implementations, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

Additionally, while this disclosure refers to e-beam scanning machine or high resolution e-beam scanning machine, it is to be understood that the teachings herein can be implemented using any type of scanning machine such as, for example, a high resolution scanning machine which may have low throughput. For example, the high resolution scanning machine can be based on high-resolution optical inspection tools. For another example, the high-resolution inspection machine can be based on ultraviolet, extreme ultraviolet, X-ray, charged particles, or neutral particles.

To describe some implementations in greater detail, reference is made to the following figures.

FIG. 1 is a block diagram of a computing device 100 used for process condition analysis, care area generation, and defect detection in accordance with the present disclosure. The computing device 100 includes a microcontroller 121, a memory unit 125 (e.g., RAM or flash memory), an input interface 128, a network interface 134, and an optional display 131. The microcontroller 121 includes a central processing unit (CPU) 122 and a graphical processing unit (GPU) 123. The GPU 123 may provide additional graphical processing capability for patterns including, but not limited to, rendering, optical mask simulation, resist simulations, and thresholding processes. The CPU 122, the GPU 123 or both may access and manipulate data in the memory unit 125.

The memory unit 125 includes various modules including but not limited to a control module 126 and other modules 127. The memory unit 125 is shown coupled to the microcontroller 121 which may execute the various modules. When the control module 126 and the other modules 127 are executed, a set of algorithms, processes, or steps may be run for realizing the functions of process condition analysis, hot spot prediction, SEM image processing, and defect detection in accordance with this disclosure. The memory unit 125 may be implemented as Random Access Memory (RAM), or any suitable non-permanent storage device that is used as memory. The memory unit 125 can include executable instructions and data for immediate access by the CPU 122, the GPU 123 or both. The memory unit 125 may include one or more DRAM modules such as DDR SDRAM. Alternatively, the memory unit 125 can include another type of device, or multiple devices, capable of storing data for processing by the CPU 122 or the GPU 123 now-existing or hereafter developed. The CPU 122 and the GPU 123 may utilize a cache as a form of localized fast memory for operating on data and instructions.

The network interface 134 may be used for communication with other computing devices to send and receive data and control signals. For example, the network interface 134 may be connected to a scanning device (not shown) including, but not limited to, an e-beam system, to receive image scans of integrated circuits or dies formed on a wafer for inspection and measurements of die features, and may send the scanned images to the CPU 122/GPU 123 for processing. As another example, remote control instructions may be received for remote control of the computing device 100 or other computing devices in the network via a designated medium, such as a data bus or Ethernet link.

The input interface 128 may be an interface, such as a keyboard or touch screen, which enables a user to enter commands or provide parameters to the computing device 100 related to an integrated and guided inline charged particle beam inspection for defect detection by a scanning device in accordance with this disclosure. For example, and without limitation, a user or operator of the computing device 100 can provide information related simulations or hot spot predictions, via the input interface 128. Parameters or other control instructions may be loaded into the memory unit 125 and stored in the control module 126.

The display 131 includes a screen driver 132 and a display screen 133 used for including, but not limited to, displaying information related to the various stages of the design, manufacturing, and inspection phases of IC manufacturing. The screen driver 132 is coupled to the microcontroller 121 and may receive instructions therefrom to drive the display screen 133. In an implementation, the display screen 133 may display including, but not limited to, SEM images, defect inspection results, care areas, simulation results, simulation parameters, or a combination thereof. The display screen 133 enables a user, such as a microchip fabrication manager, to assess current status of the wafer inspection process and the overall integrated circuit manufacturing process.

The computing device 100 may have an additional number of microcontrollers, CPUs, GPUs, memory units, or other devices for the integrated and guided inline charged particle beam inspection and defect detection of integrated circuits in accordance with the present disclosure. Other aspects of the computing device 100 are also possible including but not limited to one or more additional computing devices that may operate as a network. Some or all of the methods described herein may operate on such a network.

Figure 2:
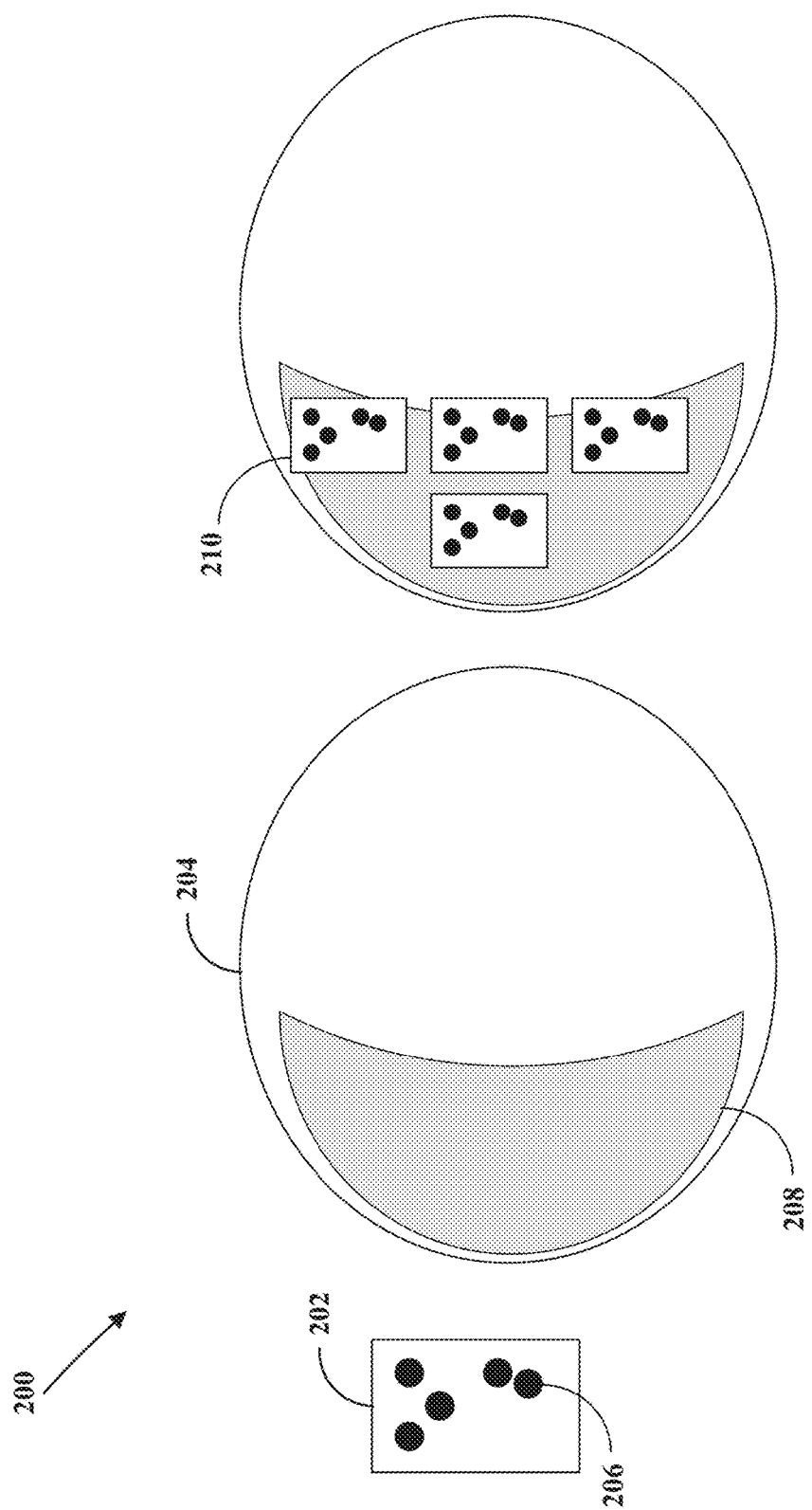
FIG. 2 is an example of an operation for hot spot prediction using process condition parameters in accordance with the present disclosure.

FIG. 2 is an example of an operation 200 for hot spot prediction using process condition parameters in accordance with the present disclosure. The operation 200 illustrates a manufacturing process and/or design process of an integrated circuit 202. The integrated circuit 202 is analyzed during the operation 200 to determine hot spots 206 (i.e., black circles on the integrated circuit 202 of FIG. 2). As used herein, a "hot spot" can also refer to a potential defect. A hot spot relates to a design pattern which, when manufactured under undesirable or unexpected manufacturing process conditions (i.e., process condition variations), can render a die inoperable or result in an actual defect within the die that affects the overall performance of the die. Undesirable or unexpected manufacturing process conditions are manufacturing conditions that deviate from the ideal process conditions. ICs manufactured under ideal process conditions exhibit minimal or no defects.

In the operation 200, a wafer 204 under inspection by an inspection process is scanned by a high-resolution system including but not limited to an electron beam (e-beam) system to obtain or provide a process condition variation map. The process condition variation map is obtained by scanning the wafer 204 for certain pre-designed or pre-selected patterns and analyzing the high-resolution images via, for example, a set of computer instructions. The pre-designed or pre-selected patterns are IC design patterns which are suspected to be sensitive to process condition variations. For example, the shapes of the pre-designed or pre-selected patterns on a wafer can change substantially when the manufacturing process experiences variations from ideal conditions. The pre-designed or pre-selected patterns can be selected based on prior knowledge (from information of an operator, information stored in a database, or information extracted using machine learning techniques) that the areas are sensitive to process condition variations. The pre-designed or pre-selected patterns can also be selected based on the chip designs of the integrated circuits being manufactured and inspected. Metrology or measurement results from these pre-designed or pre-selected patterns, obtained with an e-beam system, are then converted to process condition parameters. The process condition parameters can be used to generate one or more process condition variation maps. A process condition variation map indicates how different parts of a wafer may be affected by variations in the process conditions (e.g., variation in focus or dose). Variations in process conditions can result in defects in the manufactured dies.

In the operation 200, a process condition variation map reveals that area 208 of the wafer 204 exhibits significant process condition variations. In another implementation, the area 208 represents the process condition variation map (and not just a subset of the process condition variation map) that has been determined via the operation 200. As such, the inspection process of the operation 200 only inspects certain dies (such as die 210) of the wafer 204 for defects which is more efficient and less time-consuming than an inspection process that inspects the entire area of the wafer 204. The dies to be inspected for defects are those dies which are included in, or overlap with, the area 208. In another implementation, the dies that are inspected include dies that are within a predetermined area or distance of the area 208 even if they don't overlap with or are not housed within the area 208.

The hot spots of such dies may be determined upon further inspection to be true actual defects. Whether any of the hot spots of the die 210 is a true defect is determined by an inspection (e.g., additional scanning by the e-beam system). The hot spots of dies that are outside of, or not overlapping, the area 208 are not expected to result in actual defects and, therefore, do not have to be inspected. As described below, inspecting a hot spot means inspecting a care area that contains the hot spot. In an implementation, only care areas overlapping the area 208 are inspected. That is, instead of inspecting all the care areas of a die that is included in, or overlaps, the area 208, only the care areas inside the area 208 of those dies are inspected. While the area 208 is illustratively shown as a continuous area, this need not be the case. The shape of area 208 is not so limited and for example, can comprise various shapes separated by gaps or spaces.

In an implementation, the hot spots are assigned severity levels based upon various factors including but not limited to design features and the purpose or usage of the integrated circuits. The hot spots that are determined to have a high severity level and are thus deemed to be more important than hot spots with lower severity levels (e.g., hot spots that have high severity levels because they are near critical areas of the integrated circuit) are also scanned even if they do not fall within or overlap with the area 208. In other words, if dies that fall outside of the process condition variation map include hot spots that have been determined to have a high severity (e.g., a severity level that is greater than a threshold severity value) or importance level, they can also be scanned for actual defects.

As illustrated by the operation 200, an inspection method and system in accordance with the present disclosure significantly reduce wafer regions and dies to be inspected by a high-resolution or e-beam system. Consequently, the time and cost required to inspect a manufactured wafer and the associated integrated circuits or dies is reduced and a low throughput, high resolution, e-beam scanning machine or device can be used for in-line inspection of the semiconductor manufacturing process.

Figure 3:
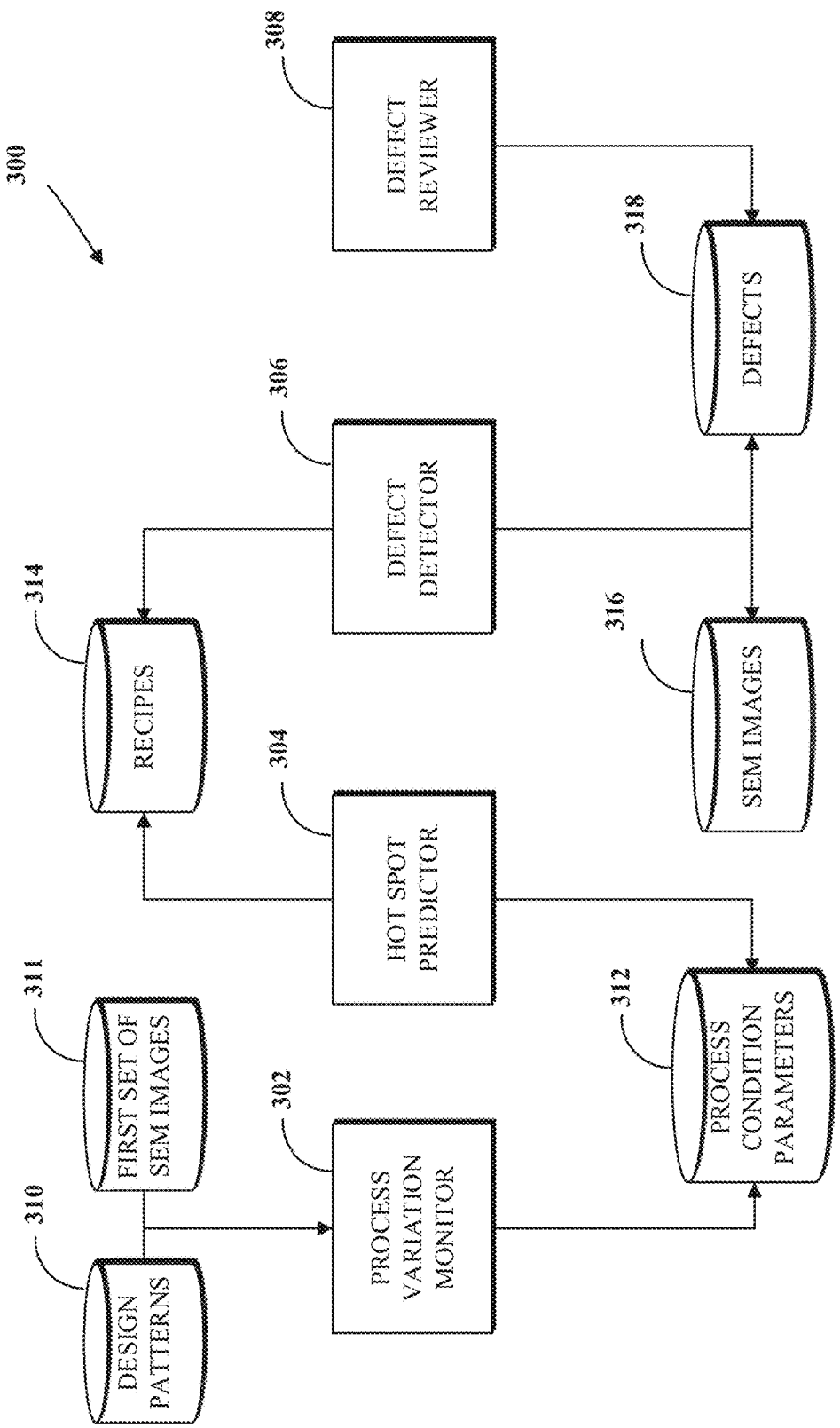
FIG. 3 is an example of a system for detecting defects in accordance with the present disclosure.

FIG. 3 is an example of a system 300 for detecting defects in accordance with the present disclosure. Aspects of the disclosure, e.g., operations of methods 400, 500, 600, 700, and 800 of FIGS. 4, 5, 6, 7, and 8, respectively, can be implemented as software and/or hardware modules in the system 300. For example, one or more apparatuses, such as the computing device 100 of FIG. 1, can implement one or more modules of the system 300. The apparatuses can be implemented by any configuration of one or more computers, such as a microcomputer, a mainframe computer, a super computer, a general-purpose computer, a special-purpose/dedicated computer, an integrated computer, a database computer, a remote server computer, a personal computer, or a computing service provided by a computing service provider, e.g., a web host, or a cloud service provider. In some implementations, the computing device can be implemented in the form of multiple groups of computers that are at different geographic locations. The system 300 can include or can be operated in conjunction with a high resolution e-beam scanning machine.

In an implementation, the system 300 includes a process variation monitor module 302, a hot spot predictor module 304, a defect detector module 306, a defect reviewer module 308, design patterns 310, a first set of SEM images 311, process condition parameters 312, recipes 314, SEM images 316, and defects 318. An arrow from a module of FIG. 3 to another component of FIG. 3 indicates an interaction initiated by the module. As explained below, the interaction can indicate a read operation, an update operation, a write operation, or any type of interaction initiated by the module from which the arrow emanates.

The design patterns 310 can be stored in a data store, such as a database, of design patterns that are known, or suspected to be, sensitive to variations in the manufacturing or fabrication process (i.e., process variations). For example, process variations can include focus variations and dose variations of the manufacturing process. Process variations can result, for example, in thickness variations, pattern defects, wrongly sized patterns, and like defects in a manufactured IC. The process variation monitor module 302 searches for matches or similarities between the design patterns 310 received or reviewed and one or more integrated circuit design layouts associated with the integrated circuits being manufactured and inspected including, but not limited to, files or layouts generated by or using an electronic design automation (EDA) software. The search can result in a list of identified design patterns. Additionally, or alternatively, the process variation monitor module 302 can receive additional patterns as described below with respect to FIG. 5.

The process variation monitor module 302 causes a high-resolution system (e.g., an e-beam system) to scan patterns on a wafer to identify wafer process condition variation maps. In this context, "cause" can mean sending commands directly to, sending commands via an intermediary mechanism or system, or any other way that causes the high resolution inspection machine to scan a wafer. The patterns are selected from pre-designed or pre-selected patterns based on, one or more or a combination of, the design rules of a layer of the wafer under manufacturing and the ideal process conditions. The patterns, which are sensitive to process condition variations, can be generated by performing simulations. For example, and without limitation, a simulation of a defocus by 10 nm can be performed and the resulting patterns can be compared to design files. Alternatively, or additionally, the resulting patterns are compared to the results of a simulation of ideal process conditions (e.g., where no defocus is performed).

The process variation monitor module 302 obtains a set of high-resolution SEM images (i.e. the first set of SEM images 311) from an inspection machine such as the e-beam system (not shown). Throughout, "obtain" means any way by which a method, a module, or a device can use the indicated information to carry out the functionality of the module or the steps of the method or device. Non limiting examples of "obtain" include requesting information from another source, receiving the information from another source, requesting that another source generate or acquire the information, retrieve from a data store, etc. The process variation monitor module 302 then analyzes the first set of SEM images 311 and calculates or computes the process condition parameters under which the patterns were manufactured. Analyzing the images includes comparing the images to reference images including, but not limited to, images generated from graphic design standard layout (GDS) files associated with the design of the integrated circuits or dies being manufactured and inspected. The process variation monitor module 302 stores the process condition parameters as process condition parameters 312. The process condition parameters 312 can be stored in a transient store, such as the memory unit 125 of FIG. 1, or a permanent store, such as the database that stores the design patterns 310 or another database.

The hot spot predictor module 304 generates care or concern areas based on the process condition parameters 312 that are received or obtained from the store that stores them. A care area is an area on a fabricated wafer, such as an area of a die, that can receive inspection for the detection of defects. A care area may be inspected because it is suspected of containing a defect in the die being manufactured. The hot spot predictor module 304 can predict hot spots (i.e., potential defects) on the IC design layouts based on the process condition parameters 312 identified by the process variation monitor module 302. The hot spot predictor module 304 obtains the process condition parameters 312 identified by the process variation monitor module 302 to determine the potential defects or hot spots.

The hot spot predictor module 304 uses the process condition parameters 312 to predict or determine hot spots and to generate a list of care areas therefrom. The hot spot predictor module 304 can generate one or more recipes 314 based on the list of care areas. The recipes 314 can be stored in a similar database that stores the design patterns 310 and the process condition parameters 312 or a different database. As used herein, a recipe can be a set of one or more machine parameters, scan conditions, care area coordinates, detection mode and other parameters to be used by the e-beam system for defect detection.

The e-beam system may be configured based on the recipes 314. The e-beam system can scan a wafer according to a recipe of the recipes 314. The hot spot predictor module 304 can be configured to save a recipe to one or more files. The inspection machine obtains the recipes and performs one or more scans based on the recipes 314. In an implementation, the hot spot predictor module 304 can cause an inspection machine to perform the inspection or the scanning based on the recipes 314. Alternatively, the defect detector module 306 can cause the inspection machine to perform scanning based on the recipes 314. Other ways, as may be configured by a fabrication workflow, can be used to cause an inspection machine to perform the scanning based on the recipes 314. The result of the scanning, based on the recipes 314, is a second set of high resolution images, such as scanning electron microscope (SEM) images 316.

In an implementation, the hot spot predictor module 304 can base the predicted hot spots on resource availability. A resource can be the amount of time available to the e-beam system to scan during the inspection process. A resource can also be the complexity of the patterns to be scanned which in turn affects the scan time. When more resources are available, warm spots can also be included in the list of hot spots to be scanned. A warm spot can be a potential defect that is less severe than a hot spot. A warm spot can be a potential defect that is less likely to be a defect than a hot spot. A warm spot can be located within a non-critical region of a die where the non-critical region is manufactured under process conditions that moderately deviate from the ideal manufacturing conditions. A warm spot can be located within a critical region of a die where the critical region is manufactured very close to the ideal manufacturing conditions. When resources are unavailable or are constrained, care areas corresponding to the warm spots can be skipped for inspection as the chances or probabilities that these warm spots adversely affect the functionality of manufactured IC chip are less in comparison to the hot spots. Whether and which warm spots are included in the list of hot spots can be a function of resource availability and based on a likelihood that a warm spot becomes a hot spot.

The defect detector module 306 determines whether the hot spots (i.e., potential defects) are actual defects. To make the determination, the defect detector module 306 can use the SEM images 316. The defect detector module 306 can, for example, compare SEM images to reference images to identify differences, and/or compare SEM images to chip design information associated with the design of the integrated circuit being manufactured and inspected to identify discrepancies between the chip design and a fabricated integrated circuit chip or die as captured in the SEM images 316. The chip design information can be one or more, or a combination, of reference images of the design, GDS files, or other information indicative of the design. The defect detector module 306 can generate information regarding the hot spots, the actual defects, or both. For example, the defect detector module 306 can store, as defects 318, information regarding which hot spots are actual defects, which hot spots are not actual defects, which defects are nuisances (i.e., not detrimental to the overall or proper functioning of a die), which defects are fatal (e.g. including but not limited to defects that affect the functioning of a die), or any combination thereof.

The defect reviewer module 308 can use the defects 318 to improve the overall hot spot prediction and inspection of the integrated circuits. The defect reviewer module 308 can be separate from, be the same as, or can work in conjunction with the hot spot predictor module 304 or other modules of the system 300 of FIG. 3. The defect reviewer module 308 continuously improves the performance of the hot spot prediction accuracy of the hot spot predictor module 304 during the course of inspection. The defect reviewer module 308 includes an update mechanism that enables the system 300 to continuously improve performance of the prediction of the potential defects or hot spots (or even warm spots). For example, if certain predicted hot spots have been previously found to not include true or actual defects, then the hot spot predictor module 304 can cease generating care areas for these certain predicted hot spots thereby shortening the time associated with the inspection process. In other words, potential defects or hot spots or the care areas generated using the hot spots that never uncover actual defects can be omitted from the inspection process to save time and costs.

Figure 4:
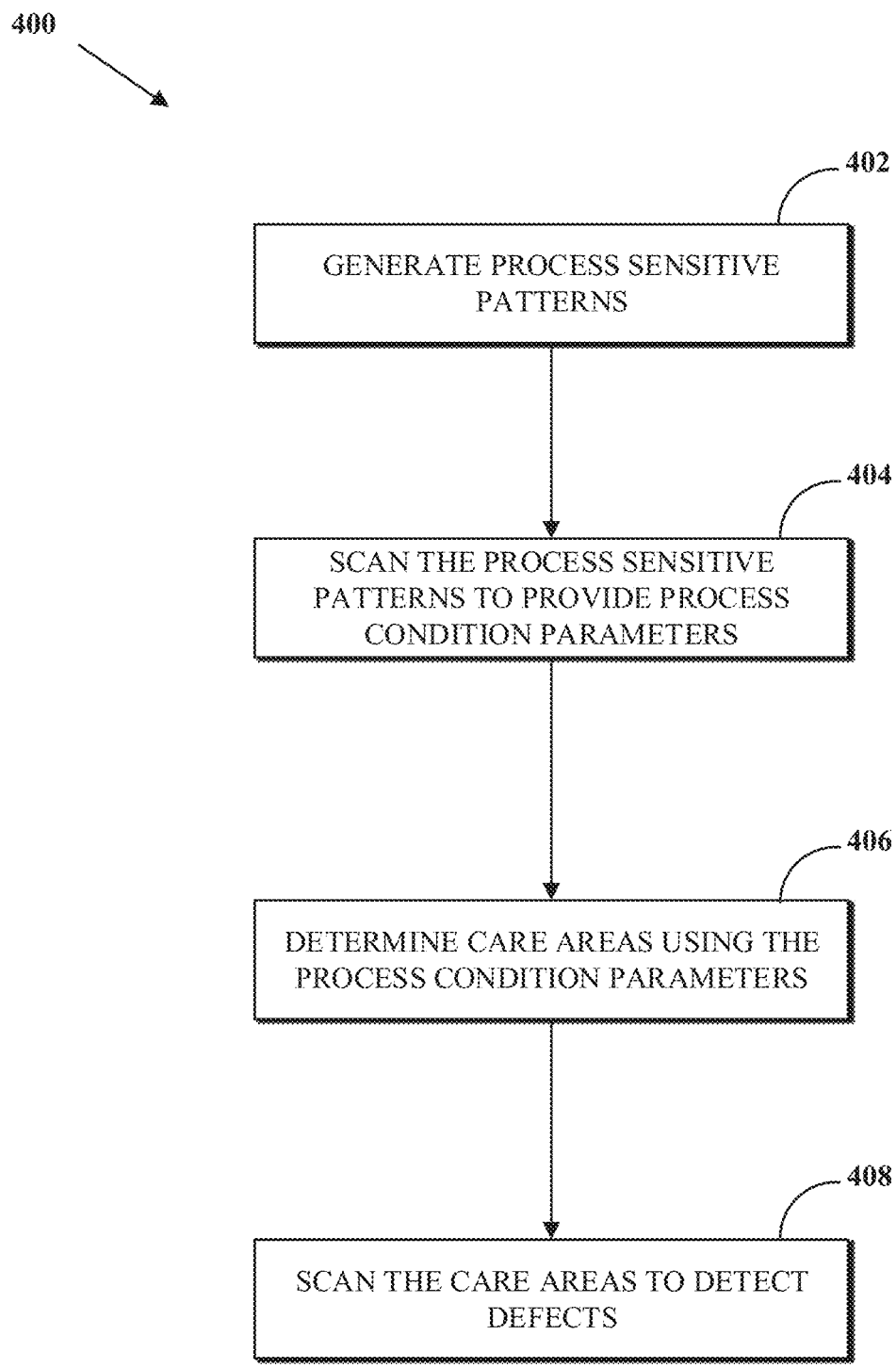
FIG. 4 is an example of a method for detecting defects in accordance with the present disclosure.

FIG. 4 is an example of a method 400 for detecting defects in accordance with the present disclosure. The method 400 includes generating process sensitive patterns via step 402, scanning the process sensitive patterns to provide process condition parameters via step 404, determining care areas using the process condition parameters via step 406, and scanning the care areas to detect defects via step 408.

The method 400 may be performed by software modules (e.g., instructions or code) executed by a processor of a computer system, such as the computing device 100 of FIG. 1, by hardware modules of the computer system, or combinations thereof. One or more steps described herein can be incorporated into, for example, wafer or reticle inspection products and be used by a semiconductor manufacturer. One or more of the steps described herein can cause an inspection machine, such as an e-beam system, to perform a scanning operation and generate SEM images that can be used by the method 400. In an implementation, the method 400 can be performed by a system such as the system 300 of FIG. 3.

Figure 5:
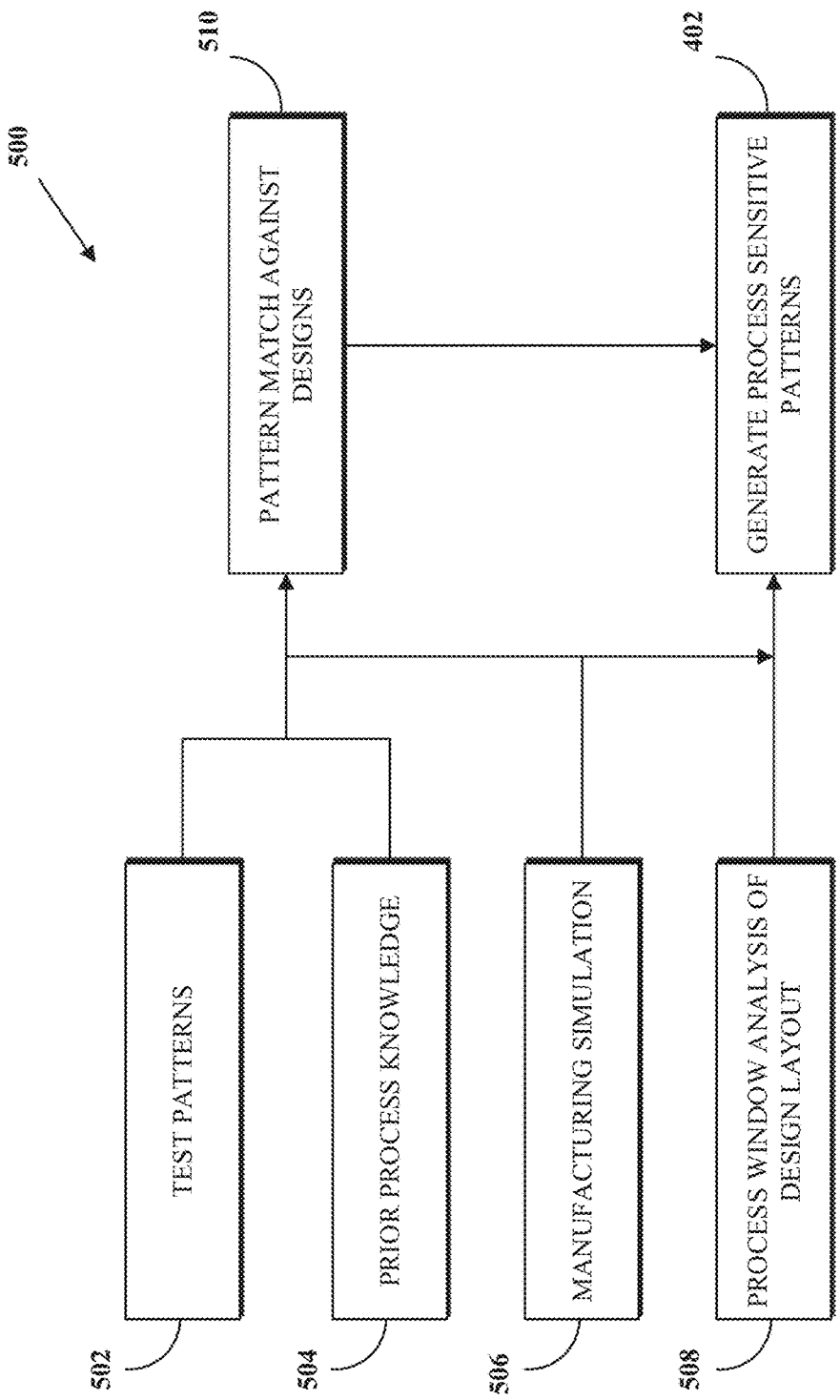
FIG. 5 is an example of a method for generating process sensitive patterns in accordance with the present disclosure.

At step 402, process sensitive patterns of an integrated circuit are generated. Process sensitive patterns are design patterns of an integrated circuit which are sensitive (or have a high sensitivity) to process condition variations associated with the fabrication or manufacturing process of the integrated circuit being inspected. FIG. 5 described below is an example of a method 500 for generating the process sensitive patterns and describes step 402 of FIG. 4 in greater detail.

Figure 6:
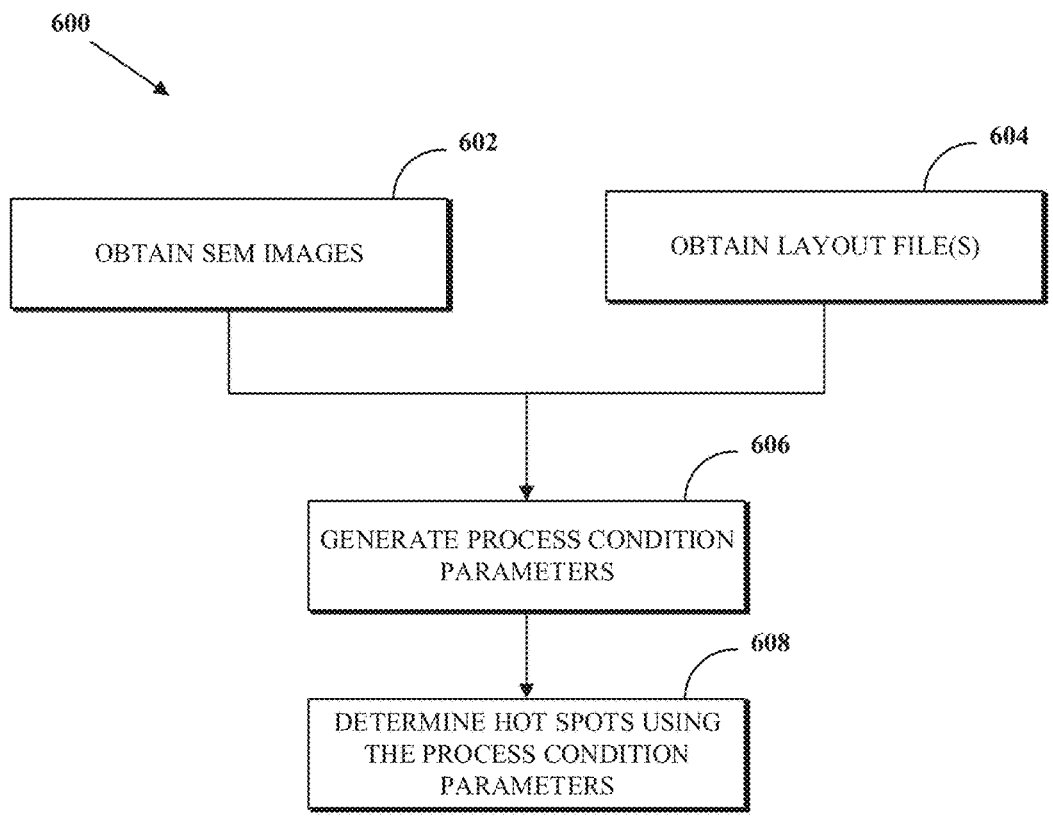
FIG. 6 is an example of a method for scanning process sensitive patterns to provide process condition parameters in accordance with the present disclosure.

At step 404, the process sensitive patterns are scanned on a wafer using a high-resolution system such as an electron beam (e-beam) system to provide process condition parameters. The step 404 can be performed on a wafer that has not been subjected to any manufacturing steps or on a wafer that has undergone one or more manufacturing steps (e.g., deposit of one layer of material). The first scan produces a first set of scanning electron microscope (SEM) images that are utilized to determine the process condition parameters. FIG. 6 described below is an example of a method 600 for scanning the process sensitive patterns to provide the process condition parameters and describes step 404 of FIG. 4 in greater detail. The process condition parameters are the process conditions under which a wafer under inspection is manufactured. The wafer is scanned for several parameters including, but not limited to, flatness. The first scan of the wafer results in one or more maps (e.g., process condition variation maps) of the wafer. An example of a map is the flatness map. The test patterns can be derived from the generation of the process sensitive patterns at step 402 that is further described via step 502 of FIG. 5.

Knowing, for example, the flatness map of the wafer can help eliminate care areas thereby reducing inspection time. For example, even though a chip may include a design that is sensitive to flatness, the chip may or may not exhibit an actual defect depending on where it is located on the wafer. For example, if a first die is located in a known (e.g., based on the wafer scan) flat area of the wafer, then the die need not be scanned for hot spots related to depth (e.g., etching depth). On the other hand, if a second die is located in a wafer area with depth variations, then the second die is to be inspected as it may exhibit an actual defect.

Figure 7:
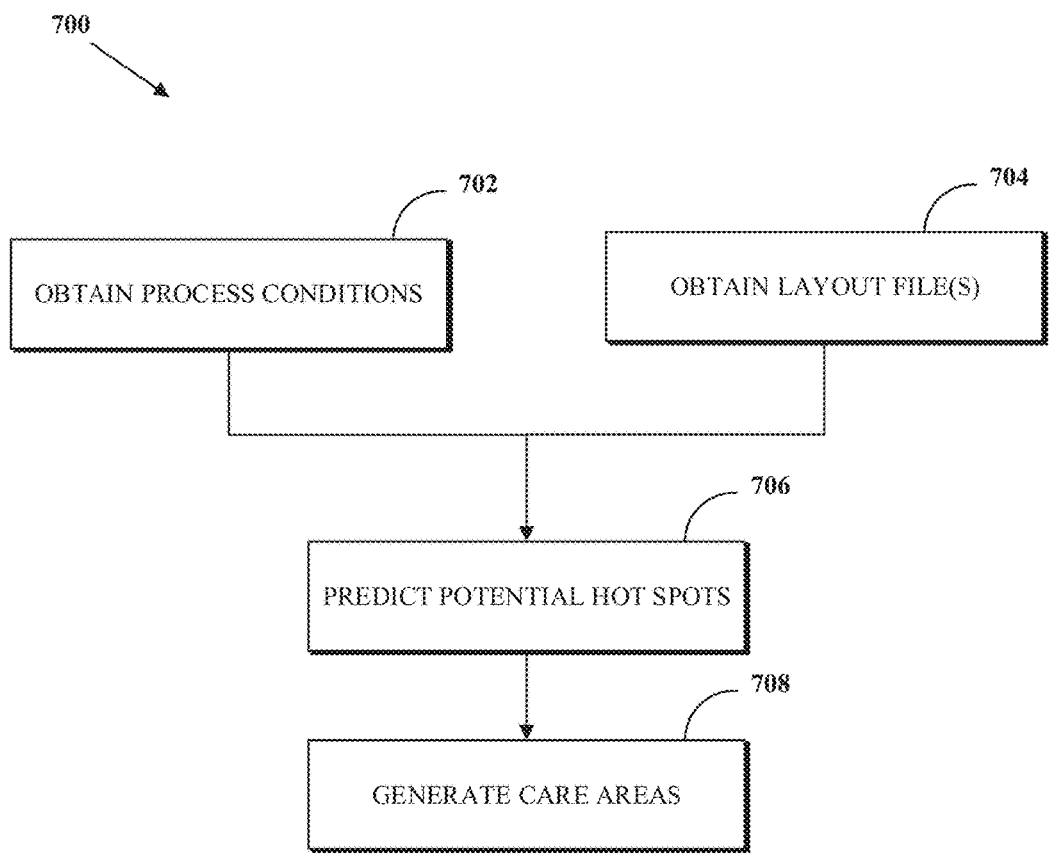
FIG. 7 is an example of a method for determining care areas using process condition parameters in accordance with the present disclosure.

At step 406, care areas are determined based on the process condition parameters. FIG. 7 described below is an example of a method 700 for determining care areas using the process condition parameters and describes step 406 of FIG. 4 in greater detail. In an implementation, the care areas are determined using the process condition parameters and in another implementation, the process condition parameters are first used to determine potential defects or hot spots of the integrated circuit and then potential defects or hot spots are then utilized to generate the care areas or a list of the care areas.

At step 408, the determined care areas are scanned to detect defects. The care areas can be scanned using the same high-resolution inspection or scanning system including but not limited to an electron beam (e-beam) system or a different system. The e-beam system can use the recipes (such as the recipes 314 of FIG. 3) to scan the wafer or integrated circuits under inspection. The e-beam system generates a second set of SEM images of the integrated circuit associated with the care areas. At step 408, the method 400 compares the second set of scanning electron microscope images to the reference SEM images and/or the chip design (i.e., design of the integrated circuit being inspected) to detect actual defects. Comparisons to the chip design can be accomplished by comparing the second set of SEM images to one or more reference images of the chip design or designs of the integrated circuit garnered from a database or via machine learning techniques. Alternatively, or in addition, comparisons to the chip design can be accomplished by comparing the second set of SEM images to one or more integrated circuit layout files of the integrated circuit that is being inspected or to the simulation results of an ideal manufacturing process.

In some implementations, the method 400 can have more or less steps or can combine steps. For example, the method 400 can store defects (such as the defects 318 of FIG. 3) detected at step 408 to a defects database.

FIG. 5 is an example of a method 500 for generating process sensitive patterns in accordance with the present disclosure. The method 500 can be carried out with respect to specific circuit (or integrated circuit or die) designs, such as the circuit designs of a customer. At step 502, test patterns are utilized to help generate the process sensitive patterns (such as via step 402 of FIG. 4). The test patterns can include but are not limited to a list of previously identified test patterns. The previously identified test patterns can be based on monitoring a current fabrication process of integrated circuits on integrated circuit production lines. The list of previously identified test patterns may additionally, or alternatively, be identified based on knowledge of or information related to the fabrication processes. The test patterns can also include specially designed test patterns that can be customer specific or specially designed based on information known about the fabrication process.

At step 504, prior process knowledge and information is utilized to help generate the process sensitive patterns (such as via step 402 of FIG. 4). For example, an engineer, such as a process engineer, design engineer, or the like, can generate a list of potential process sensitive patterns based on experience with similarly designed integrated circuits or fabrication/manufacturing processes. As aforementioned, process sensitive patterns are design patterns of the integrated circuits being inspected that are suspected to be sensitive to process condition variations in the fabrication process. The engineer can also generate the list of potential process sensitive patterns based on an analysis of the designs of ICs.

At step 506, simulation of the manufacturing or fabrication process under varying conditions is performed and the simulation information or results can be utilized to generate the process sensitive patterns (such as via step 402 of FIG. 4). Software simulation of the manufacturing processes can be performed in order to derive the process sensitive patterns. The simulation results are digital representations of a wafer as if the wafer were physically manufactured. The simulation results are used to determine how closely a manufactured product conforms to the design of an integrated circuit or chip. Different simulation runs can be executed with varying parameters. The parameters of the simulations correspond to variances in process (i.e., manufacturing or fabrication) conditions. Different manufacturing steps can be simulated under different conditions. For example, and without limitations, simulation runs can simulate material deposition, material removal, lithography, etching, annealing, oxidation, ion implantation, diffusion, and other manufacturing processes or sub-processes. Each or some of these processes can be simulated under different process conditions. For example, varying the lithography parameters can mean varying the duration of ultralight exposure or illumination. For example, varying the etching parameters can mean varying the etching process by, e.g., ±50 µm. For example, if after analysis of the chip design it is determined that some areas of the design are sensitive to depth variations, then simulations using multiple depths can be performed and the resulting digital wafers of the simulations are compared to the design of the integrated circuit.

At step 508, process-window analysis on the customer design layouts can be performed to generate the process sensitive patterns (such as via step 402 of FIG. 4). Alternatively, the method 500 includes a step (not shown) that generates the process sensitive patterns using any combination of the information generated via steps 502, 504, 506, and 508. The steps 502, 504, 506, and 508 and any combination thereof can be utilized to generate the process sensitive patterns. More or less steps can be performed by the method 500. For example, any of steps 502, 504, 506, and 508 may be omitted or altered or added to.

Once test patterns are provided via step 502 and/or prior process knowledge is provided via step 504, the outputs of these steps are utilized by a pattern matching module at step 510 that pattern matches the inputted information against various designs. For example, the potential process sensitive patterns generated via steps 502 and 504 can be combined and these potential process sensitive patterns can be compared to the current designs of the integrated circuit to find potential matches that lead to the location of the process sensitive patterns. For example, a pattern matching algorithm can be used to search designs (such as customer designs) of the integrated circuit for the test patterns or potential patterns (e.g., geometric relationships among shapes and/or edges) generated via steps 502 and 504.

FIG. 6 is an example of a method 600 for scanning the process sensitive patterns to provide the process condition parameters in accordance with the present disclosure. At step 602, high resolution images, such as SEM images, are obtained from the e-beam system initially scanning the integrated circuits of the wafer being inspected. The SEM images can include but are not limited to images of the wafer maps and patterns of the integrated circuit. At step 604, layout files including, but not limited to, GDS layout files, of the integrated circuit being inspected are obtained. As used in this disclosure, "file" means any computer implemented or accessible mechanism of storage including, without limitations, an operating system file, a database system, a net-work based storage device, and the like. At step 606, process condition parameters are generated and calculated based on a comparison of the SEM images and the layout files. The generation of the process condition parameters determines the process conditions under which the patterns on the SEM images were manufactured. The generated process condition parameters are then used to generate hot spots via step 608. The generated hot spots (or potential defects) are then utilized to generate care areas.

FIG. 7 is an example of a method 700 for determining care areas using process condition parameters in accordance with the present disclosure. At step 702, the method 700 obtains the process condition parameters generated using the generated process sensitive patterns (such as via step 606 of FIG. 6). At step 704, layout files including, but not limited to, GDS layout files, of the integrated circuit being inspected are obtained. At step 706, the method 700 predicts potential hot spots (i.e., potential defects) using the process condition parameters and the layout files garnered via steps 702 and 704 respectively. At step 708, care areas are generated using the predicted hot spots or potential defects. The method 700 can then generate recipes based on the generated care areas.

Figure 8:
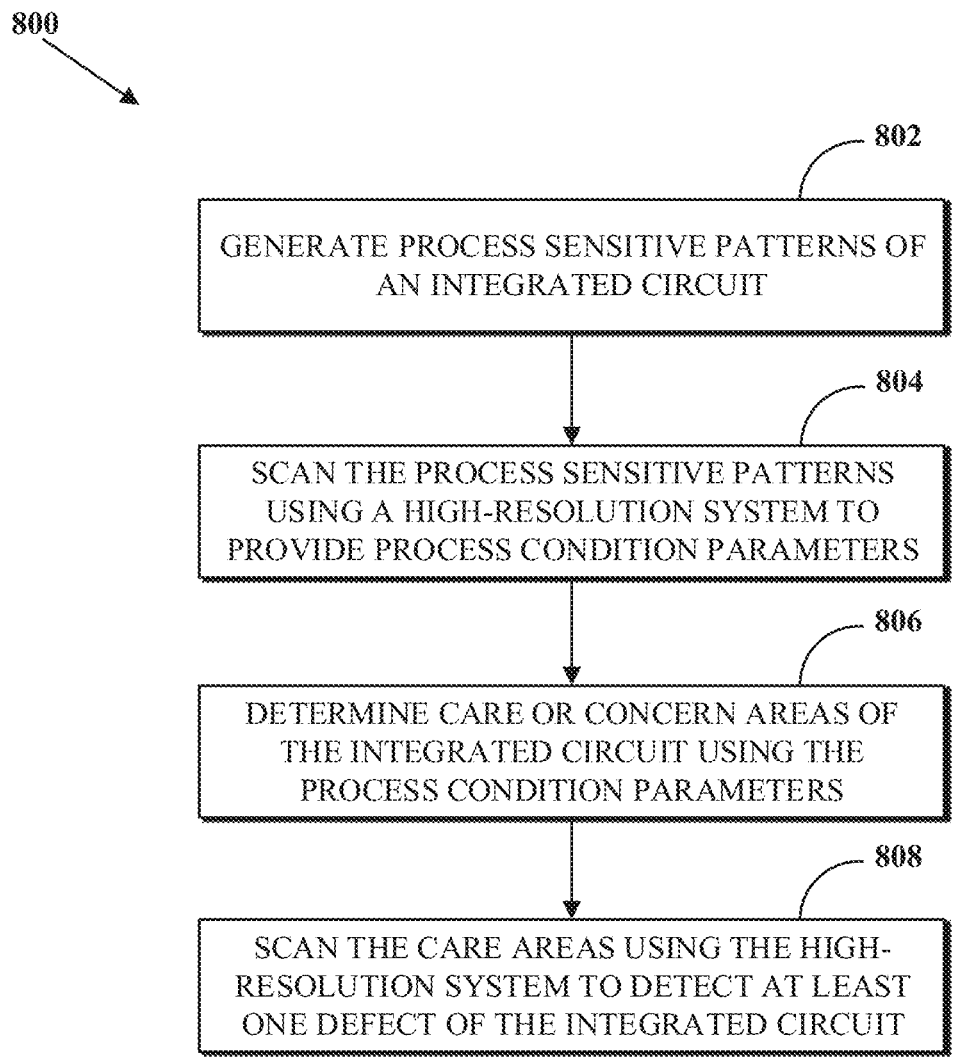
FIG. 8 illustrates a method for detecting defects of integrated circuits in accordance with the present disclosure.

FIG. 8 illustrates a method 800 for detecting defects of integrated circuits in accordance with the present disclosure. The method 800 includes generating process sensitive patterns of an integrated circuit via step 802, scanning the process sensitive patterns using a high-resolution system (including but not limited to an electron e-beam system) to provide process condition parameters of the integrated circuit via step 804, determining care or concern areas of the integrated circuit using the process condition parameters via step 806, and scanning the care areas using the high-resolution system to detect at least one defect of the integrated circuit via step 808.

The method 800 can include monitoring a fabrication process of the integrated circuits on an integrated circuit production line, wherein the process sensitive patterns are sensitive to process variations (process condition variations) in the fabrication process. In an implementation, the generating of the process sensitive patterns step comprises searching a design of the integrated circuit using design test patterns and a pattern matching algorithm to generate the process sensitive patterns, wherein the design test patterns are generated from any of the fabrication process and previous fabrication process. The generating of the process sensitive patterns can further comprise performing process-window analysis on the design of the integrated circuit to generate the process sensitive patterns.

In an implementation, the scanning of the process sensitive patterns step comprises generating a first set of scanning element microscope (SEM) images of the integrated circuit using the process sensitive patterns and determining the process condition parameters using the first set of SEM images and a layout file of the integrated circuit (including but not limited to a graphic design standard (GDS) layout file). In an implementation, the scanning of the care areas comprises generating a second set of scanning electron microscope (SEM) images of the integrated circuit using the care areas and comparing the second set of SEM images to any of a reference image and the layout file of the integrated circuit to detect the at least one defect.

In an implementation, the determining of the care areas step comprises predicting potential defects or hot spots (or warm spots that comprise the hot spots) using information comprising the layout file of the integrated circuit and the process condition parameters and determining the care areas using the predicted potential defects. The method 800 further includes storing the defects in a database and updating the information to include the defects that have been detected to continuously update the predicting of the potential defects step.

The implementations herein may be described in terms of functional block components and various processing steps. The disclosed processes and sequences may be performed alone or in any combination. Functional blocks may be realized by any number of hardware and/or software components that perform the specified functions. For example, the described implementations may employ various integrated circuit components, e.g., memory elements, processing elements, logic elements, look-up tables, and the like, which may carry out a variety of functions under the control of one or more microprocessors or other control devices. Similarly, where the elements of the described implementations are implemented using software programming or software elements the disclosure may be implemented with any programming or scripting language such as C, C++, Java, assembler, or the like, with the various algorithms being implemented with any combination of data structures, objects, processes, routines or other programming elements. Functional aspects may be implemented in algorithms that execute on one or more processors. Furthermore, the implementations of the disclosure could employ any number of conventional techniques for electronics configuration, signal processing and/or control, data processing and the like.

Aspects or portions of aspects of the above disclosure can take the form of a computer program product accessible from, for example, a computer-usable or computer-readable medium. A computer-usable or computer-readable medium can be any device that can, for example, tangibly contain, store, communicate, or transport a program or data structure for use by or in connection with any processor. The medium can be, for example, an electronic, magnetic, optical, electromagnetic, or a semiconductor device. Other suitable mediums are also available. Such computer-usable or computer-readable media can be referred to as non-transitory memory or media, and may include RAM or other volatile memory or storage devices that may change over time. A memory of an apparatus described herein, unless otherwise specified, does not have to be physically contained by the apparatus, but is one that can be accessed remotely by the apparatus, and does not have to be contiguous with other memory that might be physically contained by the apparatus.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. In other words, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an aspect" or "one aspect" throughout is not intended to mean the same implementation or aspect unless described as such.

The particular aspects shown and described herein are illustrative examples of the disclosure and are not intended to otherwise limit the scope of the disclosure in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. Many alternative or additional functional relationships, physical connections or logical connections may be present in a practical device.

The use of "including" or "having" and variations thereof herein is meant to encompass the items listed thereafter and equivalents thereof as well as additional items. Unless specified or limited otherwise, the terms "mounted," "connected," 'supported," and "coupled" and variations thereof are used broadly and encompass both direct and indirect mountings, connections, supports, and couplings. Further, "connected" and "coupled" are not restricted to physical or mechanical connections or couplings.

The use of the terms "a" and "an" and "the" and similar referents in the context of describing the disclosure (especially in the context of the following claims) should be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein are performable in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed.

The above-described implementations have been described in order to allow easy understanding of the present disclosure and do not limit the present disclosure. To the contrary, the disclosure is intended to cover various modifications and equivalent arrangements included within the scope of the appended claims, which scope is to be accorded the broadest interpretation so as to encompass all such modifications and equivalent structure as is permitted under the law.

What is claimed is:

1. A method for detecting defects of integrated circuits, the method comprising:
   generating process sensitive patterns of an integrated circuit;
   scanning the process sensitive patterns using a high-resolution system to provide process condition parameters of the integrated circuit;
   determining care areas of the integrated circuit using the process condition parameters; and
   scanning the care areas using the high-resolution system to detect at least one defect of the integrated circuit.

2. The method of claim 1, wherein the high-resolution system is an electron beam system.

3. The method of claim 1, further comprising:
   monitoring a fabrication process of the integrated circuits on an integrated circuit production line, wherein the process sensitive patterns are sensitive to process variations in the fabrication process.

4. The method of claim 3, wherein the generating process sensitive patterns comprises:
   searching a design of the integrated circuit using design test patterns and a pattern matching algorithm to generate the process sensitive patterns, wherein the design test patterns are generated from any of the monitored fabrication process and previous fabrication processes.

5. The method of claim 4, wherein the generating process sensitive patterns further comprises:
   performing a process-window analysis on the design of the integrated circuit to generate the process sensitive patterns.

6. The method of claim 1, wherein the scanning the process sensitive patterns comprises:
   generating a first set of scanning electron microscope images of the integrated circuit using the process sensitive patterns; and
   determining the process condition parameters using the first set of scanning electron microscope images and a layout file of the integrated circuit.

7. The method of claim 6, wherein the layout file of the integrated circuit is a Graphic Design Standard (GDS) layout file.

8. The method of claim 1, wherein the scanning the care areas comprises:
   generating a second set of scanning electron microscope images of the integrated circuit using the care areas; and
   comparing the second set of scanning electron microscope images to any of a reference image and a layout file of the integrated circuit to detect at least one defect.

9. The method of claim 8, wherein the determining care areas comprises:
   predicting potential defects using information comprising the layout file of the integrated circuit and the process condition parameters; and
   determining the care areas using the potential defects.

10. The method of claim 9, further comprising:
    storing the predicted potential defects in a database; and
    updating the information to include the predicted potential defects to continuously update the predicting of the potential defects.

11. A system for detecting defects of integrated circuits, the system comprising:
    a processor; and
    a memory including instructions executable by the processor to:
      generate process sensitive patterns of an integrated circuit;
      scan the process sensitive patterns using a high-resolution system to provide process condition parameters of the integrated circuit;
      determine care areas of the integrated circuit using the process condition parameters; and
      scan the care areas using the high-resolution system to detect at least one defect of the integrated circuit.

12. The system of claim 11, the memory further including instructions executable by the processor to:
    monitor a fabrication process of the integrated circuit on an integrated circuit production line, wherein the process sensitive patterns are sensitive to process variations in the fabrication process.

13. The system of claim 11, wherein to generate the process sensitive patterns comprises to:
    search a design of the integrated circuit using design test patterns and a pattern matching algorithm to locate the process sensitive patterns, wherein the design test patterns are generated from any of a fabrication process of the integrated circuit on an integrated circuit production line and previous fabrication processes.

14. The system of claim 13, wherein to generate the process sensitive patterns further comprises to:

perform a process-window analysis on the design of the integrated circuit to generate the process sensitive patterns.

15. The system of claim 11, wherein to scan the process sensitive patterns comprises to:
generate a first set of scanning electron microscope images of the integrated circuit using the process sensitive patterns; and
determine the process condition parameters using the first set of scanning electron microscope images and a layout file of the integrated circuit.

16. The system of claim 11, wherein to determine the care areas comprises to:
predict potential defects using information comprising a layout file of the integrated circuit and the process condition parameters; and
determine the care areas using the potential defects.

17. The system of claim 11, wherein to scan the care areas comprises to:
generate a second set of scanning electron microscope images of the integrated circuit using the care areas; and
compare the second set of scanning electron microscope images to any of a reference image and a layout file of the integrated circuit to detect the at least one defect.

18. A system, comprising:
a monitoring device to determine process sensitive patterns of an integrated circuit;
a scanning device to scan the process sensitive patterns to provide process condition parameters of the integrated circuit; and
a hot spot predictor to determine hot spots of the integrated circuit using the process condition parameters, wherein the scanning device scans the hot spots to detect at least one defect of the integrated circuit.

19. The system of claim 18, wherein to determine the hot spots comprises to:
predict potential defects using information comprising a layout file of the integrated circuit and the process condition parameters; and
determine the hot spots using the potential defects.

20. The system of claim 19, further comprising:
a database to store detected defects; and
an update mechanism to update the database to include information related to the at least one defect to continuously update the predicting of potential defects.

* * * * *